United States Patent [19]

Honeck et al.

[11] Patent Number: 4,800,532

[45] Date of Patent: Jan. 24, 1989

[54] CIRCUIT ARRANGEMENT WITH A PROCESSOR AND AT LEAST TWO READ-WRITE MEMORIES

[75] Inventors: Karl-Heinz Honeck, Essingen, Fed. Rep. of Germany; David Johnson, Portland, Oreg.; Manfred Neugebauer; Walter Teutsch, both of Erlangen, Fed. Rep. of Germany; M. Vittal Kini, Portland; Steven C. Stacey, Hillsboro, both of Oreg.

[73] Assignee: Siemens Aktiengesellschaft, Berlin and Munich, Fed. Rep. of Germany

[21] Appl. No.: 125,628

[22] Filed: Nov. 25, 1987

[51] Int. Cl.$^4$ .............................................. G11C 13/00
[52] U.S. Cl. .................................... 365/226; 365/228; 365/189; 320/1
[58] Field of Search ................ 365/226, 228, 229, 189, 365/233; 320/1

[56] References Cited

U.S. PATENT DOCUMENTS 4,531,214  7/1985  Torres et al. ..................... 365/228
4,631,707  12/1986  Watanabe ........................ 365/228

Primary Examiner—Terrell W. Fears
Attorney, Agent, or Firm—Volker R. Ulbrich

[57] ABSTRACT

In order for any failure of the power supply unit for two read-write memories which are operable in parallel, not to result in irreversible damage to data, two parallel power supply circuits are provided for the operation of the memories. Each power supply circuit is capable of supplying the operating current of one of the memories and the standby current of the remaining memory. Each of the power supply circuits in the power supply is buffered with capacitors in such a manner that, upon a fault in one of the power supply circuits, the output voltage, as soon as the capacitive buffer declines from a normal operating voltage to a threshold voltage and to a minimum operating voltage, data secure current reducing steps are taken. The capacitive circuits and threshold voltages are selected such that the period of time the voltage takes to decline from the threshold to the minimum operating voltage is longer than the time required to complete the present read-write operation and to save the relevant data into the memory. One of the memories is then put into standby mode by a monitoring device as the output voltage declines to the threshold voltage leaving only one active memory which can be operated from one of the two memory power supply circuits.

3 Claims, 1 Drawing Sheet

CIRCUIT ARRANGEMENT WITH A PROCESSOR AND AT LEAST TWO READ-WRITE MEMORIES

FIELD OF THE INVENTION

This invention relates to electronic data processing systems and more particularly to a circuit arrangement in which at least one read-write random access memory for address-controlled data communication is provided a processor.

BACKGROUND OF THE INVENTION

A system configuration with a processor connected to a RAM for address controlled data communications is characteristic of several commercial microcomputer systems. In order to ensure that the data are retained in the random access memory in the case where the associated power supply fails in said circuit arrangements, measures such as the two following ones have typically been taken: buffering by large filter/storage capacitor of the random access memory against a power failure; and redundant design of the random access memory against either self-induced faults or errors in one of the random access memories.

A power supply design which combines both fault protection measures, however, involves relatively high hardware costs, since the typical apparatus is designed for each power supply to have a capacity of twice the RAM operating current. In that way in case of failure of one power supply the remaining supply can single-handedly deliver the required current.

SUMMARY OF THE INVENTION

It is the object of this invention to create a buffered and redundant circuit arrangement in such a manner that, while the hardware cost is low, the data are retained in RAM memories in case of a fault in the power supply unit.

Briefly stated in accordance with one aspect of the invention the aforementioned object can be achieved by providing a circuit arrangement having at least one read-write memory for address-controlled data communication connected to a processor including a power supply unit including two memory power supply circuits connected in parallel with each other and connected to the read-write memories, each said memory power supply circuit having a maximum current capacity corresponding to the sum of an operating current of a first read-write memory and a standby current of second read-write unit; a capacitive current buffer as a part of the output of each of said memory power supply circuits having capacitors of sufficient size to provide, upon a fault of one of said memory supplies during the operation of both said read-write memories, a voltage discharge time constant which decreases from a threshold voltage to a minimum allowable operating voltage in at least a time period which corresponds to a time required for one of said read write memories to complete the current data communication and change to the standby mode; and a monitoring device connected to one of said read-write memories, and to said memory power supply which upon the discharge of the parallel memory power supply voltage to said threshold voltage indicates the change of the read-write memory it is connected to, in a standby mode.

As the current draw in the standby mode is relatively slight, the power supply unit can be designed for an output significantly lower than in the arrangement cited at the outset. The two power supply circuits of the power supply unit can be designed to operate from line power and/or from a battery.

In another aspect of the invention for the case of failure of the unbuffered power supply for the processor, the aforementioned object is achieved by providing for the processor a further power supply circuit of the power supply unit having the output voltage of this power supply circuit capacitively buffered so that, if said power supply circuit fails, the output voltage discharges from a threshold voltage lying above the regular operating voltage to a minimum allowable operating voltage within a period of time that corresponds to at least the time required to switch the first read-write memory from the operating mode into a standby mode; and that, if the output voltage discharges to the threshold voltage of the monitoring device, the first read-write memory can be placed in the standby mode.

In a further aspect of the invention a control signal indicating the placement of the first read-write memory in the standby mode is supplied to the processor and if one of the power supply circuits for the read-write memories fails. the processor is by this control signal immediately informed of this fault. It would also be possible, however, for the status of the first read-write memory to be interrogated or read in each case by the processor and, on the basis of this interrogation, for the presence of a fault to be detected In yet a further aspect of the invention a resetting of the first read-write memory by a separate reset signal ensures that start-up after a fault is not possible without other measures, but that an auxiliary operation must be carried out for this purpose.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

DESCRIPTION OF THE PREFERRED EMBODIMENT

Figure 1:
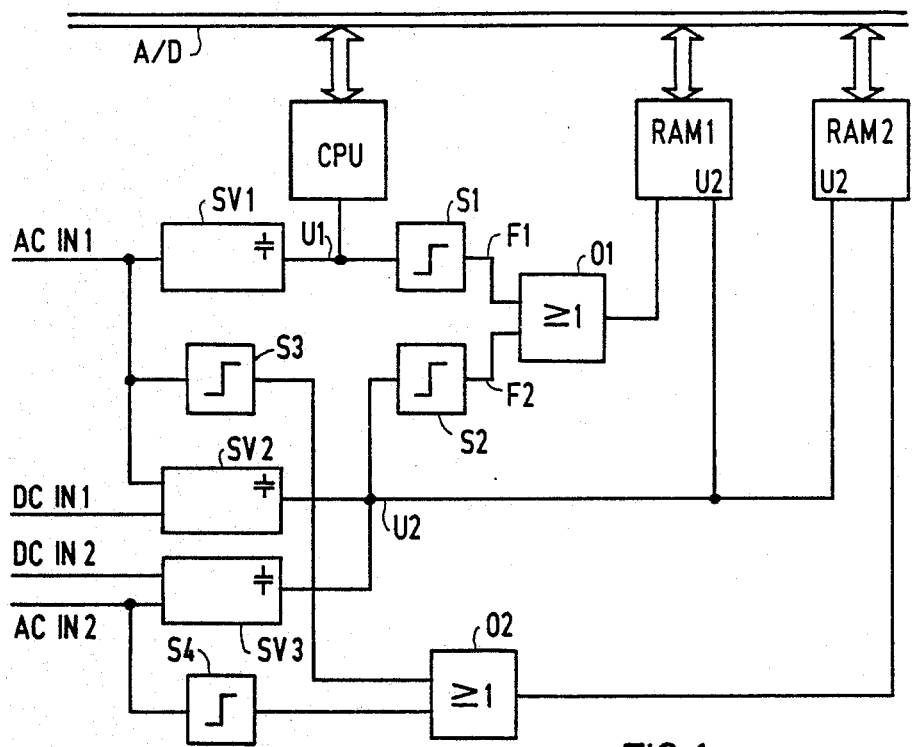
FIG. 1 shows a circuit arrangement in accordance with the invention.

The illustration of FIG. 1 shows a processor CPU, which engages in a bidirectional data exchange, through an address and data bus A/D (address bus A and data bus D may also be designed as a redundant sub-systems), with two read-write memories RAM1 and RAM2, which in regular operation are operated in parallel. For the supply of power to the processor CPU and to the read-write memories RAM1 and RAM2 a power supply unit is provided which consists of a line-operated power supply circuit SV1 for the processor CPU, and parallel power supply circuits SV2 and SV3 for the read-write memories RAM1 and RAM2. The power supply circuits SV2 and SV3 are supplied with power both from the line and from a battery on the input side. Securing the power supply with a battery prevents a loss of important data in the read-write memories RAM1 and RAM2 in case of power outages.

The power supply circuit SV1 generates an output voltage U1 for the operation of the processor CPU; and the power supply circuits sv2 and sv3 provide an output voltage U2 to the associated read-write memories RAM1 and RAM2. The output voltages U1 and U2 are each capacitively buffered. This buffering can be implemented with appropriate capacitors in the power supply circuits SV1, SV2 and SV3. The buffering capacitances could, however, be arranged as capacitors at any other locations as well. It is essential only that said capacitors each have the output voltage U1 or U2, respectively, applied across them.

The power supply circuit SV1 is designed in such a manner that they can deliver the maximum operating current of the processor CPU; the power supply units SV2 and SV3 are designed in such a manner that each of them individually can deliver the standby current of one of the read-write memories and the operating current of the other read-write memory.

If both the power supply circuits SV2 and SV3 are undisturbed, then as a consequence both read-write memories RAM1 and RAM2 can be in operation; if, however, one of the power supply circuits SV2 or SV3 is a fault condition, the design of the maximum output current of the power supply circuits SV2 and SV3 does make possible the continued operation of the read-write memory RAM2; however, in said case the possible redundant operation of the read-write memory RAM1 is dispensed with.

There are two independent DC supply sources (DC IN1, DC IN2) (actually batteries) which provide power for the RAM's when both AC feeds are unavailable. Each SV can supply RAM power based on these sources.

In order to detect the fault, a monitoring device is provided, which includes two threshold stages S1 and S2, respectively; if the output voltage U1 goes below a threshold voltage $U1_S$, the threshold stage S1 supplies an error signal F1 to an OR element 01 and if the output voltage U2 goes below a threshold voltage $U2_S$, the threshold stage S2 supplies an error signal F2 to said OR element 01.

If a fault is present, the read-write memory RAM1 is caused, through a control line, to switch from the operating mode to the standby mode.

The circuit arrangement contains two AC failure detect blocks S3. S4 and an OR element 02 which indicates when an AC feed has failed. If either AC feed has failed the RAM2 is shut down.

Figure 2:
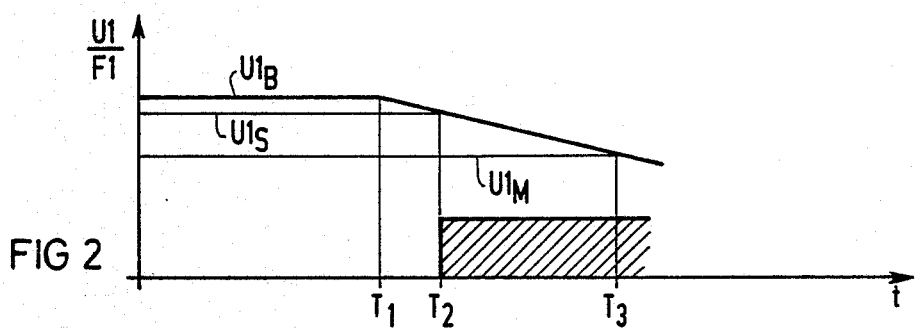
FIG. 2 shows a first diagram of a supply voltage versus time during a power supply fault.
Figure 3:
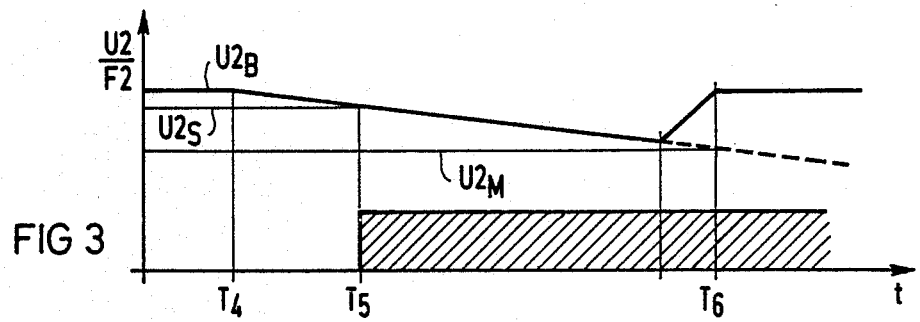
FIG. 3 shows a second diagram of a supply voltage versus time during a power supply fault.

FIGS. 2 and 3 illustrate the operation of UE and the threshold voltage $U1_S$ and $U2_S$. The illustration of FIG. 2 shows, essentially, a diagram of voltage versus time for the output voltage U1 of the power supply circuit SV1. From the origin of coordinates to a point T1 on the time t axis, suppose a regular operating voltage $U1_B$ is present. At time T1 let there be assumed a fault in the power supply circuit SV1, which has the result that the capacitively buffered output voltage U1 of the power supply circuit SV1 declines or discharges in accordance with the operating current draw of the processor CPU. The decline from the regular operating voltage $U1_B$ to a minimum allowable operating voltage $U1_M$ is roughly linear; the resultant slope from the time of the fault T1 to the time T3, at which the minimum allowable operating voltage for the processor CPU is present, depends on the value of the capacitance buffering the output voltage U1, obviously the fault under consideration does not include a short of the output of the power supply circuit SV1. The larger the buffering capacitance for the output voltage U1 is, the longer is the period of time between times T1 and T3. Said period of time is selected such that it is longer than the time, determined by the system, required to shut down the read-write memory RAM1 after writing the data present at RAM1 at the time of the fault. Accordingly, at time T2 in the diagram of FIG. 2 a threshold voltage $U1_S$, lying below the regular operating voltage $U1_B$ and above the minimum operating voltage $U1_M$ is reached. The period of time between time T2 and time T3 is then available for shut down the first read-write memory RAM1.

The fact that an error signal F1 is emitted by the threshold stage S1 starting at time T2 is expressed in the illustration of FIG. 2 in that a shaded bar is shown starting at this time.

In the sample embodiment of FIG. 2, the threshold voltage is located relatively near the regular operating voltage $U1_B$; if the output capacitance for the power supply circuit SV1 were increased, however, the threshold voltage $U1_S$ could be selected much closer to the minimum operating voltage $U1_M$. The selection of a desired difference between the regular operating voltage $U1_B$ and the threshold voltage $U1_S$ and, accordingly, of the corresponding output capacitance of power supply circuit SV1, are design trade-offs of the type familiar to those skilled in the art.

In the illustration of FIG. 3, the output voltage U2 of the power supply circuits SV2 and SV3 is also shown as a function of time t. It is initially assumed that the output voltage takes on a normal operating value $U2_B$ and, from the time of a fault T4 to time T6, declines to the minimum allowable operating voltage $U2_M$. Here it is also assumed that, from the time the threshold voltage $U2_S$ is reached until time T5, there remains a period of time for the operation of the device, within which the read-write memory RAM1 can complete current data reads or writes as the case may be and save the relevant data before the standby mode command is implemented. When the RAM1 read-write memory achieves a standby status, the current draw on the remaining power supply declines from the sum of two RAM operating currents to the sum of one RAM operating current and one RAM standby current. Consequently, since this latter current draw is indefinitely supportable by the remaining power supply due to its design, the power supply voltage recovers, as shown in FIG. 3, towards the normal value of $U2_B$ after standby mode is achieved at T6. Since from time T5 the error signal F2 from the threshold stage S2 is present, an appropriate shaded bar is also indicated in said diagram. The relationship between the position of the threshold voltage $U2_S$ relative to the operating voltage $U2_B$ and the span of time from time T5 to time T6 corresponds to the relationship between the threshold voltage $U1_S$, the operating voltage $U1_B$, and the period time from time T2 to time T3. Said relationships are the same as the ones which have already been discussed in detail in regard to FIG. 2.

It will now be understood that there has been disclosed an improved circuit arrangement for the supply of power to a processor and two RAM memories. As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed is:

1. A circuit arrangement having at least one read-write memory for address-controlled data communication connected to a processor, comprising:
   a power supply unit including two memory power supply circuits connected in parallel with each other and connected to the read-write memories, each said memory power supply circuit having a maximum current capacity corresponding to the sum of the operating current of a first read-write memory and a standby current of second read-write unit;
   a capacitive current buffer as a part of the output of each of said memory power supply circuits having capacitors of sufficient size to provide, upon a fault of one of said memory supplies during the operation of both said read-write memories, a voltage discharge time constant which decreases from a threshold voltage to a minimum allowable operating voltage in at least a time period which corresponds to a time require for one of said read-write memories to complete a current data communication and change to a standby mode; and
   a monitoring device connected to one of said read-write memories, and to said memory power supply, which upon the discharge of the parallel memory power supply voltage to said threshold voltage causes the change into the standby mode of the read-write memory it is connected to.

2. A circuit arrangement having at least one read-write memory for address-controlled data communication connected to a processor, comprising:
   a power supply unit including a processor power supply circuit connected to the processor;
   a capacitive current buffer as a part of an output of said processor power supply circuits having capacitors of sufficient size to provide, upon a fault of said processor supply during the operation of said processor, a voltage discharge time constant which decreases from a threshold voltage to a minimum allowable operating voltage in at least a time period which corresponds to a time required for one of said read-write memories to complete a current data communication and change to a standby mode; and
   a monitoring device connected to one of said read-write memories which upon the discharge of the processor power supply voltage to said threshold voltage initiates the change into the standby mode of the read-write memory said monitoring device is connected to.

3. A circuit arrangement according to claim 1 further comprising two alternative voltage failure detect blocks and an OR element which indicates when an alternative voltage failure has failed.

* * * * *

UNITED STATES PATENT AND TRADEMARK OFFICE
CERTIFICATE OF CORRECTION

PATENT NO. : 4,800,532

DATED : January 24, 1989

INVENTOR(S) : HONECK et al.

It is certified that error appears in the above-identified patent and that said Letters Patent is hereby corrected as shown below:

On title page:

Section [73] after "Germany" insert --and Intel Corporation, Santa Clara, California--

Signed and Sealed this

Fourteenth Day of January, 1992

Attest:

HARRY F. MANBECK, JR.

Attesting Officer

Commissioner of Patents and Trademarks